United States Patent
Shiu et al.

(10) Patent No.: US 8,134,874 B2
(45) Date of Patent: Mar. 13, 2012

(54) DYNAMIC LEAKAGE CONTROL FOR MEMORY ARRAYS

(75) Inventors: Shinye Shiu, Mountain View, CA (US); Vincent R. von Kaenel, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 470 days.

(21) Appl. No.: 12/355,389

(22) Filed: Jan. 16, 2009

(65) Prior Publication Data

US 2010/0182850 A1 Jul. 22, 2010

(51) Int. Cl.
*G11C 7/10* (2006.01)

(52) U.S. Cl. .............. 365/189.06; 365/189.07; 365/154; 365/226

(58) Field of Classification Search .......... 365/189.06, 365/189.07, 154
See application file for complete search history.

(56) References Cited

U.S. PATENT DOCUMENTS

| | | | |
|---|---|---|---|
| 7,420,857 B2 * | 9/2008 | Hirota et al. ........... 365/189.09 | |
| 7,436,721 B2 | 10/2008 | Lehmann et al. | |
| 7,447,101 B2 | 11/2008 | Fallah et al. | |
| 7,557,553 B2 | 7/2009 | Su et al. | |
| 2005/0135162 A1 | 6/2005 | Somasekhar | |
| 2008/0055966 A1 | 3/2008 | Ramaraju et al. | |

FOREIGN PATENT DOCUMENTS

WO 2007/127922 11/2007

OTHER PUBLICATIONS

International Search Report from PCT/US2010/021191, mailed Mar. 26, 2010, 12 pages.

* cited by examiner

*Primary Examiner* — Vu Le
*Assistant Examiner* — Han Yang
(74) *Attorney, Agent, or Firm* — Lawrence J. Merkel; Meyertons, Hood, Kivlin, Kowert & Goetzel, P.C.; Erik A. Heter

(57) ABSTRACT

A memory circuit is disclosed that comprises a plurality of memory cells coupled to a virtual voltage rail. The plurality of memory cells may form, for example, a sub-array of an SRAM array. A switching circuit may be coupled between the virtual voltage rail and a voltage supply node, and a comparator may be coupled to compare a voltage level present on the virtual voltage rail to a reference voltage to thereby provide an output signal based on the comparison. The switching circuit may be configured to electrically couple the virtual voltage rail to the voltage supply node depending upon the output signal. In some embodiments, the switching circuit may be implemented using either a PMOS transistor or an NMOS transistor, although other embodiments may employ other switching circuits.

19 Claims, 10 Drawing Sheets

DYNAMIC LEAKAGE CONTROL FOR MEMORY ARRAYS

BACKGROUND OF THE INVENTION

1. Field of the Invention

This invention relates to memory circuits, and more particularly, to controlling leakage in memory circuits.

2. Description of the Related Art

Static random access memory (SRAM) is used in a wide variety of applications. Such applications include cache memories, registers files, buffers, and so forth. Unlike its dynamic RAM (DRAM) counterpart, an SRAM does not require a periodic refresh to maintain its contents. Nevertheless, SRAMs are subject to leakage currents.

SRAM may be implemented using a plurality of memory cells, each of which is configured to store a bit of information. Each memory cell may include a plurality of transistors. Various ones of the transistors of a given memory cell may be active (i.e. turned on) in order to store a bit of information, while others may be inactive (i.e. turned off). However, the inactive transistors may still be subject to leakage currents between their respective drain and source nodes. Despite such leakage currents, the cells of an SRAM will typically maintain their contents as long as power is applied. However, applying constant power to the cells of an SRAM array may adversely affect overall power consumption.

SUMMARY OF THE INVENTION

Various embodiments of memory circuits employing dynamic leakage control are disclosed. In one embodiment, a memory circuit comprises a plurality of memory cells coupled to a virtual voltage rail. The plurality of memory cells may form, for example, a sub-array of an SRAM array. A switching circuit may be coupled between the virtual voltage rail and a voltage supply node, and a comparator may be coupled to compare a voltage level present on the virtual voltage rail to a reference voltage to thereby provide an output signal based on the comparison. The switching circuit may be configured to electrically couple the virtual voltage rail to the voltage supply node depending upon the output signal. In some embodiments, the switching circuit may be implemented using either a PMOS transistor or an NMOS transistor, although other embodiments may employ other switching circuits.

A method for dynamically controlling leakage is also disclosed. In one embodiment, the method comprises comparing a voltage level present on a virtual voltage rail to a reference voltage, wherein the virtual voltage rail is coupled to a memory sub-array. The method further comprises providing an output signal depending on a result of said comparing; and activating a switching circuit depending upon the output signal, wherein the switching circuit, when activated, pulls the voltage level present on the virtual voltage rail toward a voltage level present on a corresponding voltage supply node.

BRIEF DESCRIPTION OF THE DRAWINGS

Other aspects of the invention will become apparent upon reading the following detailed description and upon reference to the accompanying drawings in which.

Figure 1:
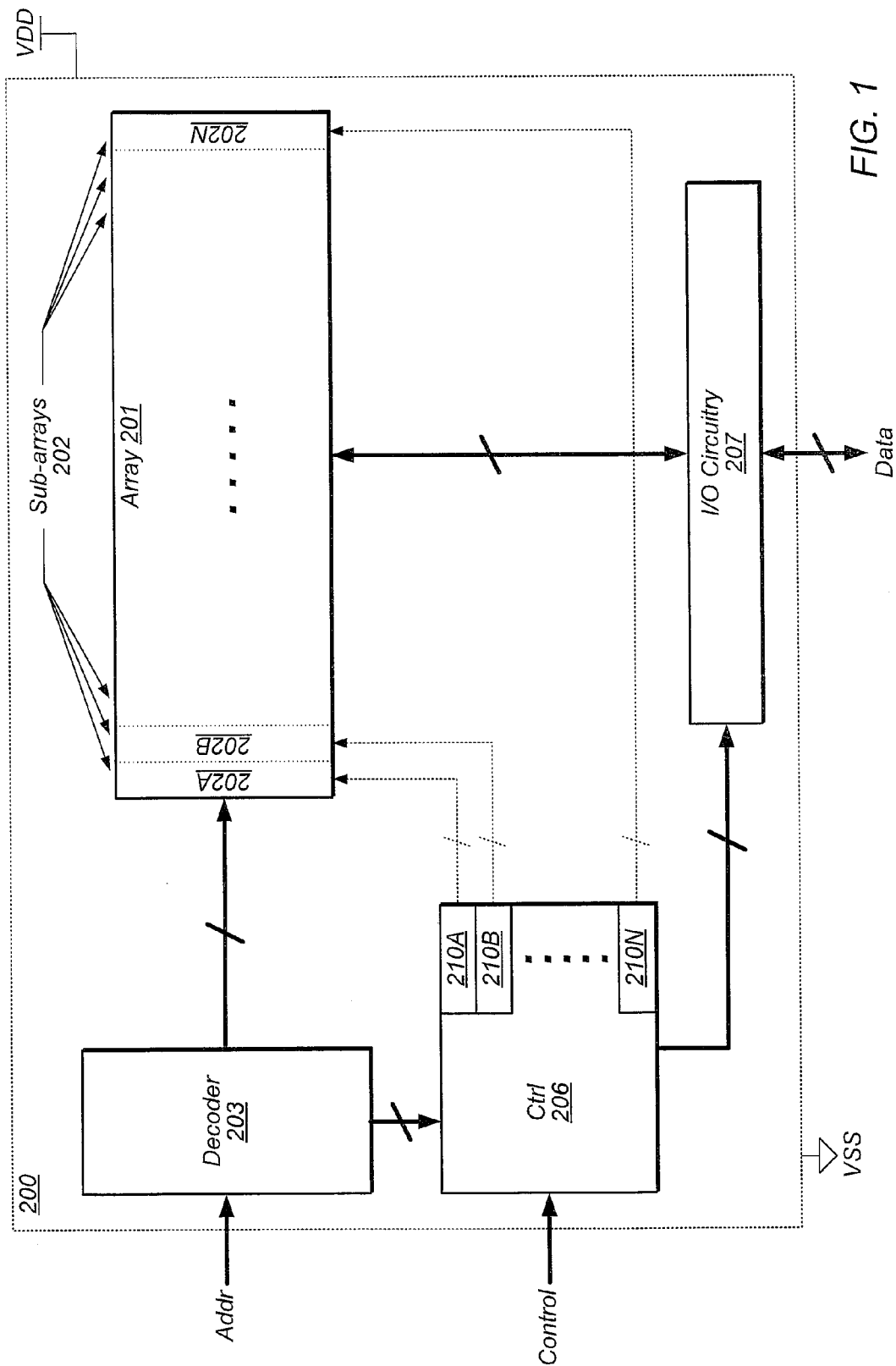
FIG. 1 is a block diagram illustrating one embodiment of a memory circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

FIG. 1 is a block diagram illustrating one embodiment of a memory circuit. In the embodiment shown, memory circuit 200 includes a memory array 201 organized in a plurality of sub-arrays 202A-202N. The exact number of sub-arrays 202 may vary from one embodiment to another. In some embodiments, memory array 201 may be organized in separately accessible memory banks, wherein each of the banks includes one or more of sub-arrays 202A-202N. As will be discussed below, each sub-array 202A-202N includes a plurality of memory cells which may be arranged in rows and columns. In one embodiment, memory array 201 is an SRAM (static random access memory) array.

Memory circuit 200 also includes a decoder 203, a control unit 206, and I/O circuitry 207. In the embodiment shown, decoder 203 is an address decoder configured to decode addresses provided to memory circuit 200 for read and write operations. Decoded address information from decoder 203 is provided to memory array 201 in order to drive word lines corresponding to an addressed location.

I/O circuitry 207 provides an interface between array 201 and a data bus to accommodate data transfers during read and write operations. For example, in various embodiments, I/O circuitry 207 may include sense amplifiers for sensing memory cell contents during read operations and drivers for driving data to memory cells during write operations, as well as multiplexing circuitry for routing data from/to corresponding bit lines of selected memory cells during such accesses. I/O circuitry 207 may also include logic that generates signals to enable the sense amplifiers (during read operations) and the drivers (during write operations).

Control logic 206 is configured to provide various control functions for memory circuit 200, such as the generation of enable signals for read and write operations. As shown, control logic 206 may additionally include a plurality of leakage control circuits 210A-210N, each of which is associated with a corresponding one of the plurality of sub-arrays 202A-202N. Each leakage control circuit 210 is configured to prevent the loss of data stored in memory cells of its corresponding sub-array 202, and may also be configured to provide power gating for the corresponding sub-array 202. Various embodiments of leakage control circuits 210 will be discussed in further detail below.

Figure 2:
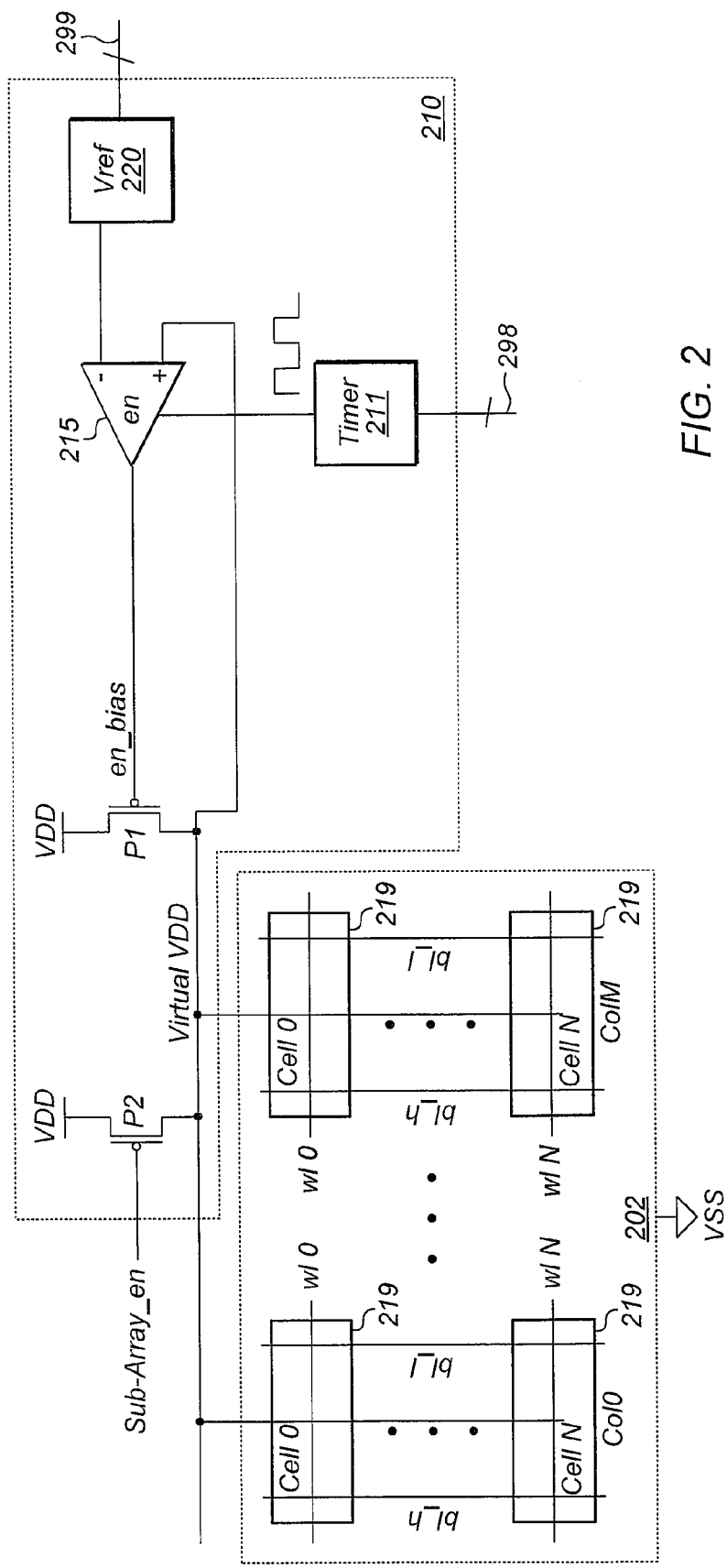
FIG. 2 is a schematic diagram of one embodiment of a leakage control circuit coupled to a memory sub-array.

Turning now to FIG. 2, a schematic diagram of one embodiment of a leakage control circuit 210 coupled to a memory sub-array 202 is shown. For the sake of simplicity in this and subsequent embodiments to follow, sub-array 202 is representative of any of the sub-arrays 202A-202N of FIG. 1, and leakage control circuit 210 is representative of any of the leakage control circuits 210A-210N of FIG. 1.

Sub-array 202 in the embodiment shown includes a plurality of memory cells 219 organized into M columns of N rows each. For example, one embodiment of sub-array 202 may include 8 columns (M=8) of 64K rows (N=64K) each. However, the specific number of rows and columns may vary from one embodiment to the next, and there is no specific limit on the values of M or N. In the depicted embodiment, each memory cell 219 in a given column shares a pair of bit lines (bl_h and bl_l). The cells in each row share a common word line (e.g., wl 0 is shared by cell 0 of each column).

Figure 3:
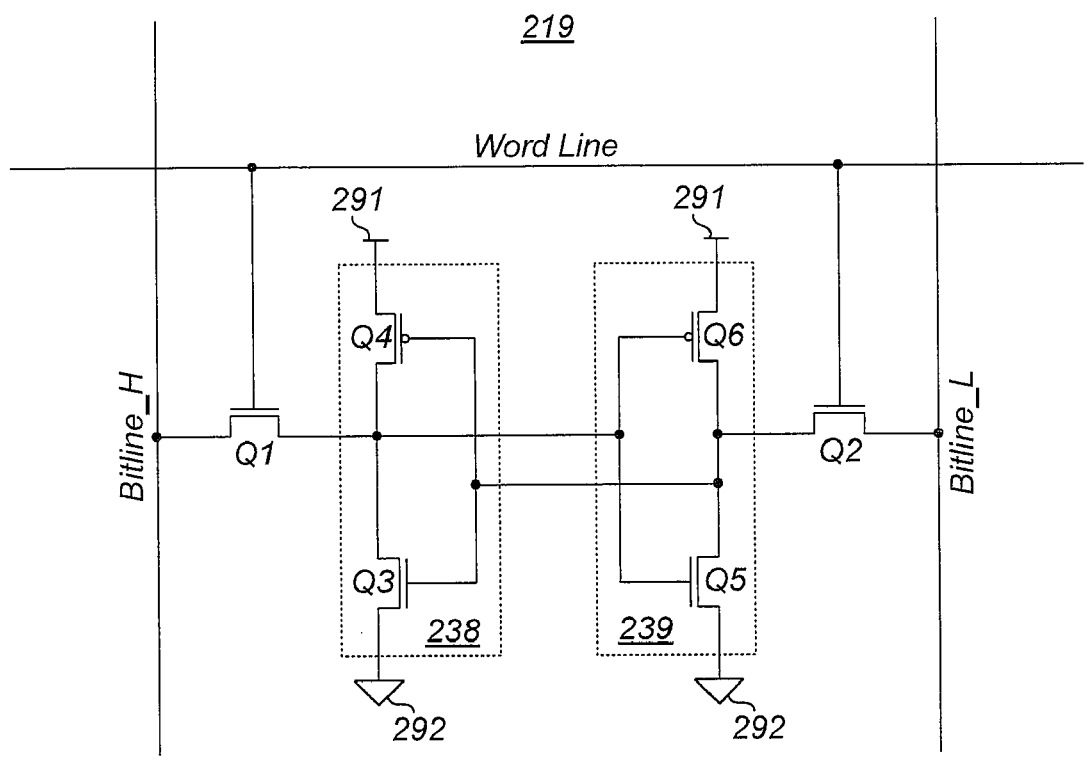
FIG. 3 is a schematic diagram of one embodiment of a memory cell.

An implementation of one embodiment of a memory cell 219 is shown in FIG. 3. The memory cell shown in FIG. 3 includes cross-coupled inverters 238 and 239 that form a keeper circuit. The output of inverter 238 and the input of inverter 239 are each coupled to a first passgate transistor, Q1, which is in turn coupled to a first one of a pair of complementary bit lines, Bitline_H. Similarly, the input of inverter 238 and the output of inverter 239 are coupled to a second passgate transistor, Q2, which is in turn coupled to a second one of the pair of complementary bit lines, Bitline_L. It is noted that Bitline_H and Bitline_L in FIG. 3 correspond to the bit lines labeled bl_h and bl_l, respectively, of FIG. 2.

When storing information, the output values present on the output terminals of inverters 238 and 239 at any given time are complements of each other. For example, when memory cell 219 is storing a logic 1 (e.g., a logic high voltage) on the output terminal of inverter 238, a logic 0 (e.g., a logic low voltage) is stored on the output terminal of inverter 239.

The gate terminals of each of transistors Q1 and Q2 are coupled to a word line. When memory cell 219 is to be accessed, the word line is driven high (e.g., by decoder 203 and/or other control circuitry). If the operation is a read operation, data stored by the keeper circuit comprising cross-coupled inverters 238 and 239 propagates through passgate transistors Q1 and Q2, respectively, to the bit lines and is sensed by a sense amplifier (e.g., of I/O circuitry 207). If the operation is a write operation, corresponding data is driven onto the bit lines by I/O circuitry 207, where it propagates through the passgate transistors Q1 and Q2 to inverters 238 and 239, respectively, and may overwrite the current state of memory cell 219. When the read or write operation is complete, the word line falls low, resulting in the deactivation of passgate transistors Q1 and Q2, and thereby isolating inverters 238 and 239 from the bit lines.

Memory cell 219 includes two voltage rails 291 and 292 to facilitate the supply of power for the memory cell. As will be discussed further below, one of these voltage rails may be a virtual voltage rail. For example, in the embodiments of FIGS. 2 and 4, voltage rail 291 is a virtual voltage rail (e.g., virtual VDD rail). In the embodiments to be discussed with reference to FIGS. 6 and 7, voltage rail 292 is a virtual voltage rail (virtual VSS rail). As used herein, the term "voltage rail" (or "voltage supply rail/node") refers to a node on which a voltage is provided from a power supply unit to facilitate the supply of power to a device. The term "virtual voltage rail" as used herein refers to a node on which a voltage from a voltage rail is provided through a switching circuit such that at times it is isolated from the voltage rail (e.g., a voltage rail that is coupled to a supply voltage node through one or more transistors or switching circuits that may be inactive at certain times). In various embodiments, one of the voltage rails 291 or 292 may provide a voltage of 0 volts with respect to an external ground, thus forming a ground rail (or a virtual ground rail).

It should be noted that the memory cell 219 of FIG. 3 is an exemplary embodiment of a memory cell that may be implemented in sub-array 202 (and thus memory array 201). Other types of memory cells having a greater or lesser number of transistors and different specific configurations are possible and contemplated.

Since one of voltage rails 291 or 292 is a virtual voltage rail, memory cell 219 may be subject to the effects of leakage. More particularly, each of transistors Q3-Q6 may be susceptible to leakage currents when inactive. This leakage can reduce the voltage difference between voltage rails 291 and 292, and may result in the loss of stored data if left unchecked. However, as will be discussed below, various embodiments of a leakage control circuit are provided which may prevent the loss of stored data.

Returning back to FIG. 2, each cell 219 of sub-array 202 in the embodiment shown is coupled to a virtual voltage rail, in this case, virtual VDD. The virtual VDD rail of sub-array 202 may be electrically coupled to a supply voltage rail, or VDD rail, through either of PMOS transistors P1 or P2 when either one of these transistors are active. Transistor P2 is referred to as a power gater, while transistor P1 is referred to as a bias transistor. When sub-array 202 is to be accessed during read and write operations, a sub-array enable signal (sub-array_en) is asserted (e.g., by control logic 206) as a logic low and provided to the gate terminal of transistor P2 just prior to the access, and may be de-asserted once the access is complete. Transistor P2 is activated responsive to the logic low on its gate terminal, thereby providing a pull-up path between the VDD rail and the virtual VDD rail. Accordingly, just prior to each access to sub-array 202, the virtual VDD rail is pulled up toward the voltage that is present on the VDD rail to ensure proper read and write operations. When sub-array 202 is not being accessed, the sub-array enable signal is de-asserted by transitioning to a logic high, thereby turning off transistor P2 and decoupling the virtual VDD rail from the VDD rail. As a result of transistor P2 being in an inactive state, the voltage level present on the virtual VDD rail may fall somewhat due to leakage in cells 219 of sub-array 202, although the amount that the voltage level falls may be limited by leakage control circuit 210 as described below.

In the embodiment shown, leakage control circuit 210 includes a comparator 215, which may be implemented using any suitable comparator circuitry (e.g., a Schmitt trigger). The non-inverting input of comparator 215 is coupled to the virtual VDD rail, while the inverting input is coupled to receive a reference voltage from a reference voltage unit 220. The reference voltage supplied by reference voltage unit 220 is a threshold voltage that provides a basis for comparison with the voltage level present on the virtual VDD rail. For example, in one particular implementation the voltage present on the VDD rail may be 1 volt, while the reference voltage provided by reference voltage unit 220 may be 0.7 volt (although these voltages may be different depending on the embodiment). In various embodiments, reference voltage provided by reference voltage unit 220 may be programmable through input 299.

Assuming comparator 215 is enabled, when the voltage level of the virtual VDD rail is greater than the reference voltage, the output of comparator 215 (which corresponds to the bias enable signal bias_en in the depicted embodiment) is driven high. Thus, transistor P1 is held in an inactive state (turned off). If the voltage level on the virtual VDD rail falls below that of the reference voltage, the bias enable signal output by comparator 215 is driven low. The low bias enable signal thus results in the activation of transistor P1. When P1 is activated (turned on), the voltage level of the virtual VDD rail is pulled up toward the voltage level present on the voltage rail VDD. Responsive to the voltage level of the virtual VDD rail being pulled up to a level greater than that of the reference voltage provided by reference voltage unit 220, comparator 215 causes the bias enable signal to transition high and thus causes the deactivation of P1. Accordingly, leakage control circuit 210 may prevent a loss of data due to leakage by periodically pulling the voltage on the virtual VDD rail back towards the voltage level of the VDD rail and above the level of the reference voltage provided by reference voltage unit 220.

In the embodiment shown in FIG. 2, leakage control circuit 210 includes a timer 211. Timer 211 is configured to generate a clock signal that is applied to an enable input of comparator 215. For example, in one embodiment, timer 211 is configured to generate a clock signal having a predetermined frequency and duty cycle. In one embodiment, the duty cycle may be 50%, although other duty cycle values are possible. In addition, the frequency and/or duty cycle of the clock signal generated by timer 211 may be programmable in various embodiments according to one or more control signals received via input 298. Comparator 215 in one embodiment is configured to be enabled when the clock signal is high and disabled when the clock signal is low. When disabled, comparator 215 does not perform a comparison operation and therefore does not drive an output signal. Comparisons are thus performed in this embodiment only when comparator 215 is enabled. By periodically enabling and disabling comparator 215, enhanced control of the leakage control process and/or improved operation may be achieved.

It is noted that timer 211 may be implemented using a variety of specific circuit configurations, as desired, and may include phase locked loop and/or other types of circuitry, such as a counter and/or a divider, in order to set the frequency of the clock signal to a desired value. It is further noted that embodiments of leakage control circuit 210 that do not utilize a timer (i.e. embodiments wherein comparator 215 is always enabled during operation) are also possible and contemplated.

Figure 5:
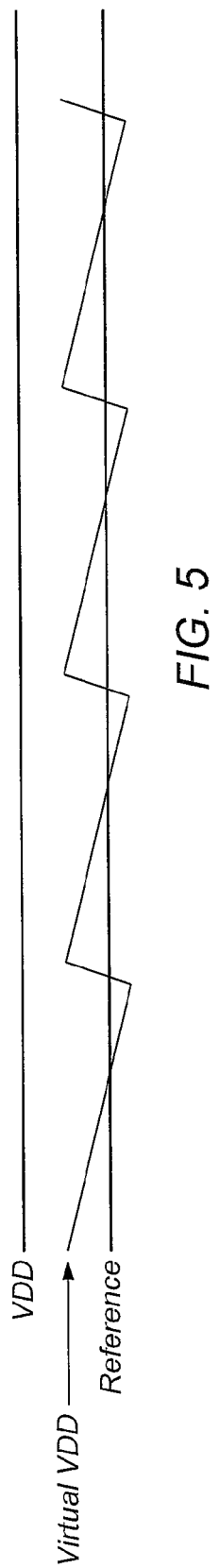
FIG. 5 is a timing diagram illustrating operation of one embodiment of a leakage control circuit.

A resulting operation of the embodiment shown in FIG. 2 is illustrated in the timing diagram of FIG. 5. As shown in the diagram, the voltage present on the virtual VDD rail ('Virtual VDD') may fall over time (i.e., due to leakage currents). After this voltage falls below the level of the reference voltage ('Reference'), the action of the comparator and the bias transistor as described above causes the voltage level to be pulled back up towards the voltage present on the VDD rail ('VDD'). This cycle may repeat itself, although it is noted that an access to the corresponding sub-array 202 may interrupt the cycle at any time, causing the power gater transistor P2 to be activated, thereby pulling up the voltage present on the virtual VDD rail regardless of whether it has fallen below the reference voltage.

Figure 4:
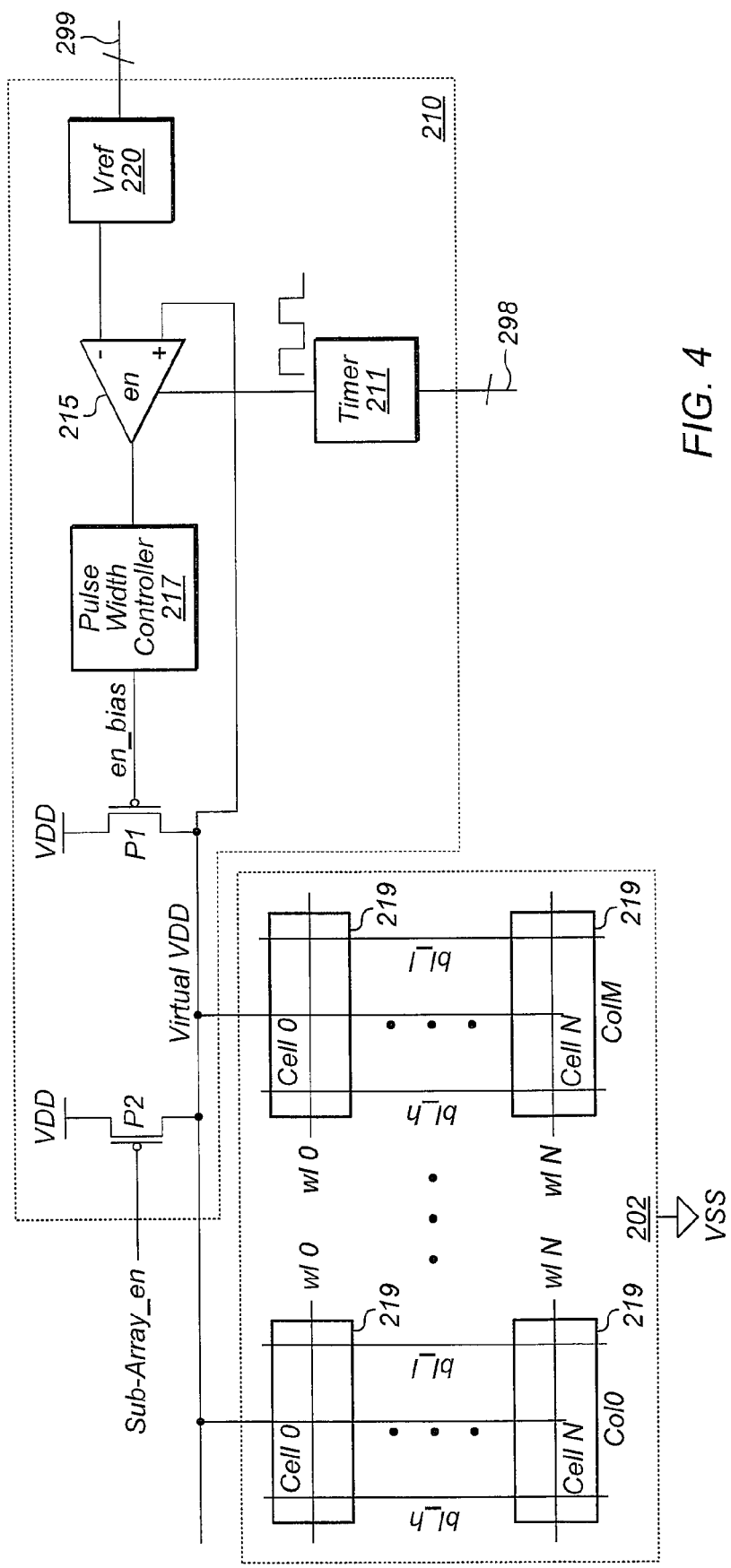
FIG. 4 is a schematic diagram of another embodiment of a leakage control circuit coupled to a memory sub-array.

In some implementations of memory circuit 200, for example, if transistor P1 is a relatively large device (thus having a strong drive and a fast switching time), it may be desirable to reduce the duration that the bias enable signal is driven low and thus the duration that transistor P1 is active. Accordingly, in various embodiments a pulse width controller may be used to control the length of time that the bias enable signal is asserted, and thus the amount of time that transistor P1 is active. FIG. 4 is a schematic diagram illustrating such an embodiment of a leakage control circuit 210 utilizing a virtual VDD rail. Circuit portions that correspond to those of FIG. 2 are numbered identically for the sake of simplicity. In addition to the circuit elements described above, the leakage control circuit 210 of FIG. 4 also includes a pulse width controller 217 coupled between the output of comparator 215 and the gate terminal of P1. In this embodiment, pulse width controller 217 may be configured to reduce the pulse width of the bias enable signal (en_bias) generated in response to the output signal provided by comparator 215.

Figure 6:
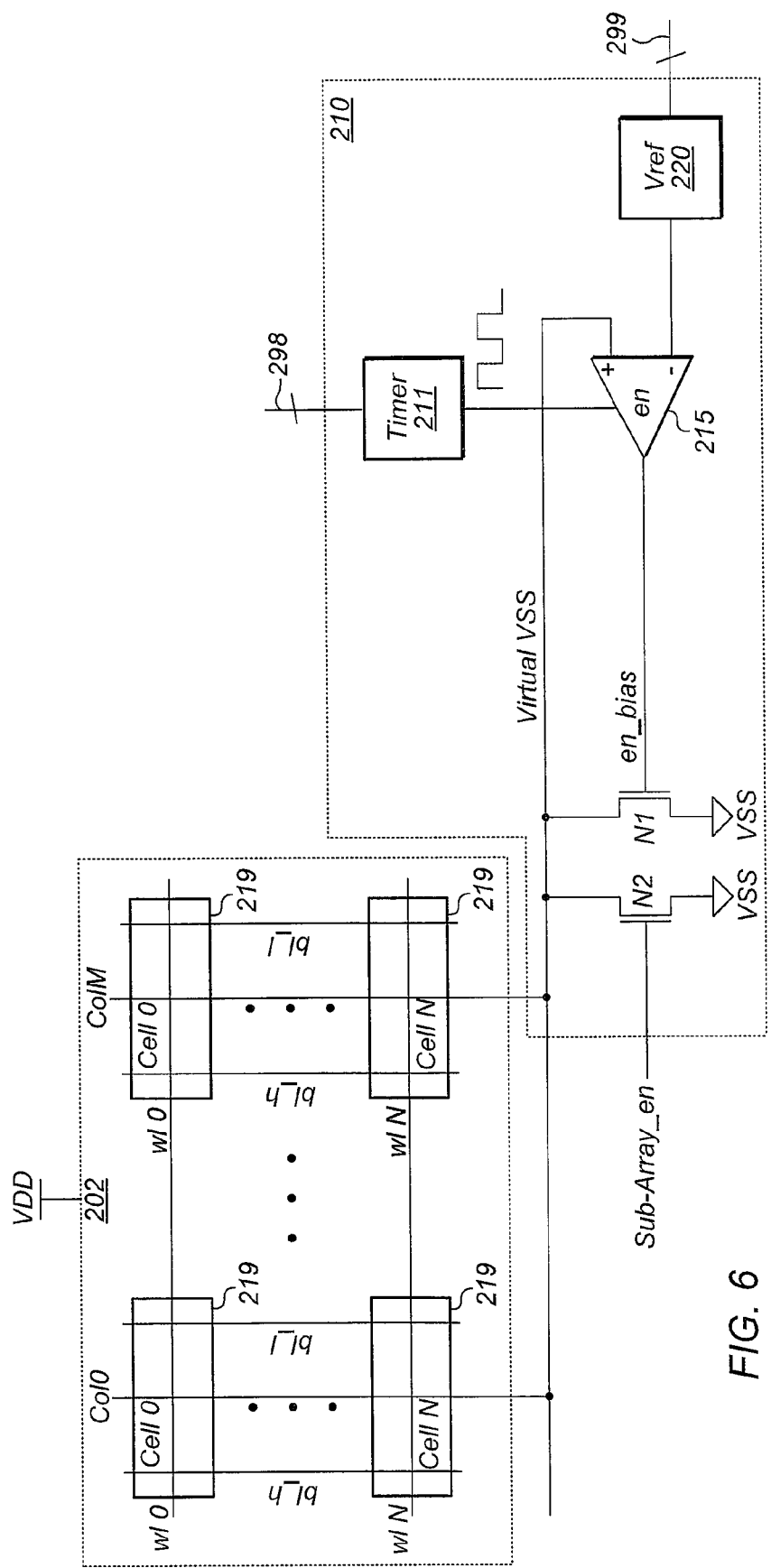
FIG. 6 is a schematic diagram of another embodiment of a leakage control circuit coupled to a memory sub-array.
Figure 7:
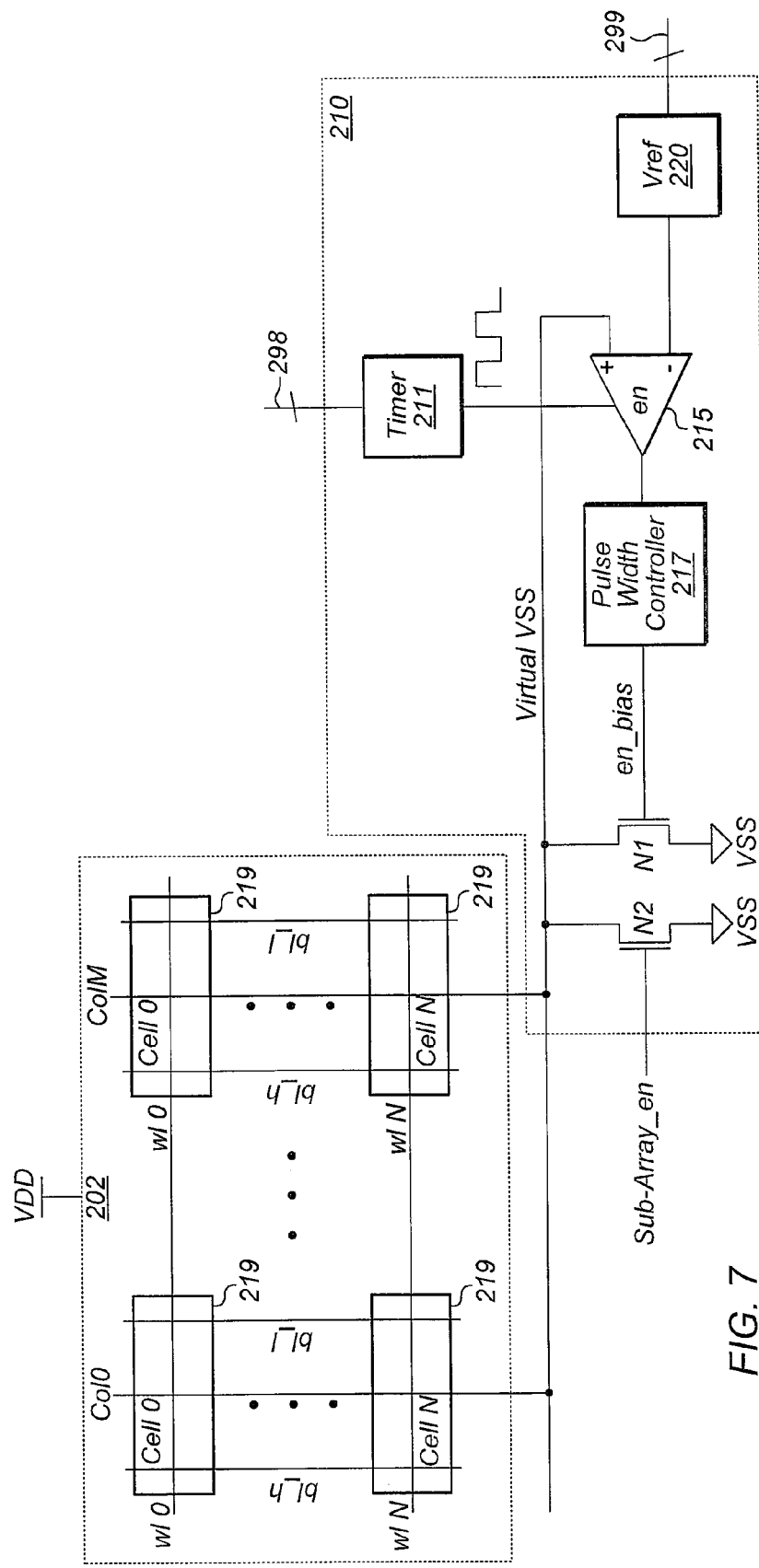
FIG. 7 is a schematic diagram of another embodiment of a control circuit coupled to a memory sub-array.

FIGS. 6 and 7 illustrate alternate embodiments of leakage control circuits 210. Circuit portions that correspond to those of FIGS. 2 and 4 are again numbered identically for the sake of simplicity. Instead of utilizing a virtual VDD rail, the leakage control circuits 210 of FIGS. 6 and 7 each utilize virtual VSS (e.g., virtual ground) rails. When transistors N1 and N2 are both inactive, the voltage present on the virtual VSS rail is allowed to rise (due to leakage currents). The voltage level present on the virtual VSS rail may be compared to a reference voltage level (received from reference voltage unit 220) by comparator 215. If the voltage level present on the virtual VSS rail exceeds the reference voltage provided by reference voltage unit 220, comparator 215 will, when enabled, assert an output signal that results in the bias enable signal transitioning high. Responsive to the high bias enable signal, transistor N1 will become active, thereby creating a pull down path from the virtual VSS rail to VSS rail (i.e. the virtual VSS rail is electrically coupled to the VSS rail when N1 is active). The voltage level on virtual VSS rail is then pulled down toward the voltage level present on the VSS rail until transistor N1 becomes inactive. It is noted that leakage control circuit 210 of FIG. 7 includes a pulse width controller 217, which may be used in some embodiments for reasons similar to those discussed above for the embodiment of FIG. 4.

Leakage control circuits 210 of FIGS. 6 and 7, both include a power gater transistor (N2 in both embodiments). Power gater transistor N2 is activated just prior to an access of sub-array 202. When active, transistor N2 provides a pull down path between the virtual VSS rail and the VSS rail. After the access is completed, power gater transistor 202 is deactivated.

In addition to the embodiments discussed above with reference to FIGS. 2 and 4, leakage control circuits 210 of FIGS. 6 and 7 both include a timer 211 configured to generate a clock signal that is used to periodically enable comparator 215. However, it is noted that other embodiments wherein comparator 215 is always enabled during circuit operation (and thus do not include such a timer) are also possible and contemplated.

Figure 8:
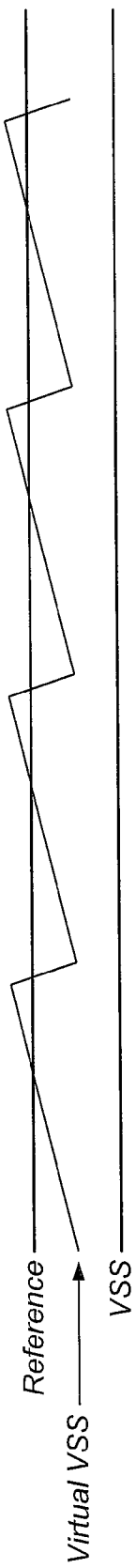
FIG. 8 is a timing diagram illustrating operation of another embodiment of a control circuit.

A resulting operation of the embodiments shown in FIGS. 6 and 7 is illustrated in the timing diagram of FIG. 8. As shown in the diagram, the voltage present on the virtual VSS rail is may rise over time (i.e. due to leakage currents). After this voltage rises above the level of the reference voltage, the action of the comparator and the bias transistor as described above causes the voltage level to be pulled back down towards the voltage present on the VSS rail. This cycle may repeat itself, although it is noted that an access to the corresponding sub-array 202 may interrupt the cycle at any time, causing the power gater transistor N2 to be activated, thereby pulling down the voltage present on the virtual VSS rail regardless of whether it has risen above the reference voltage.

Figure 9:
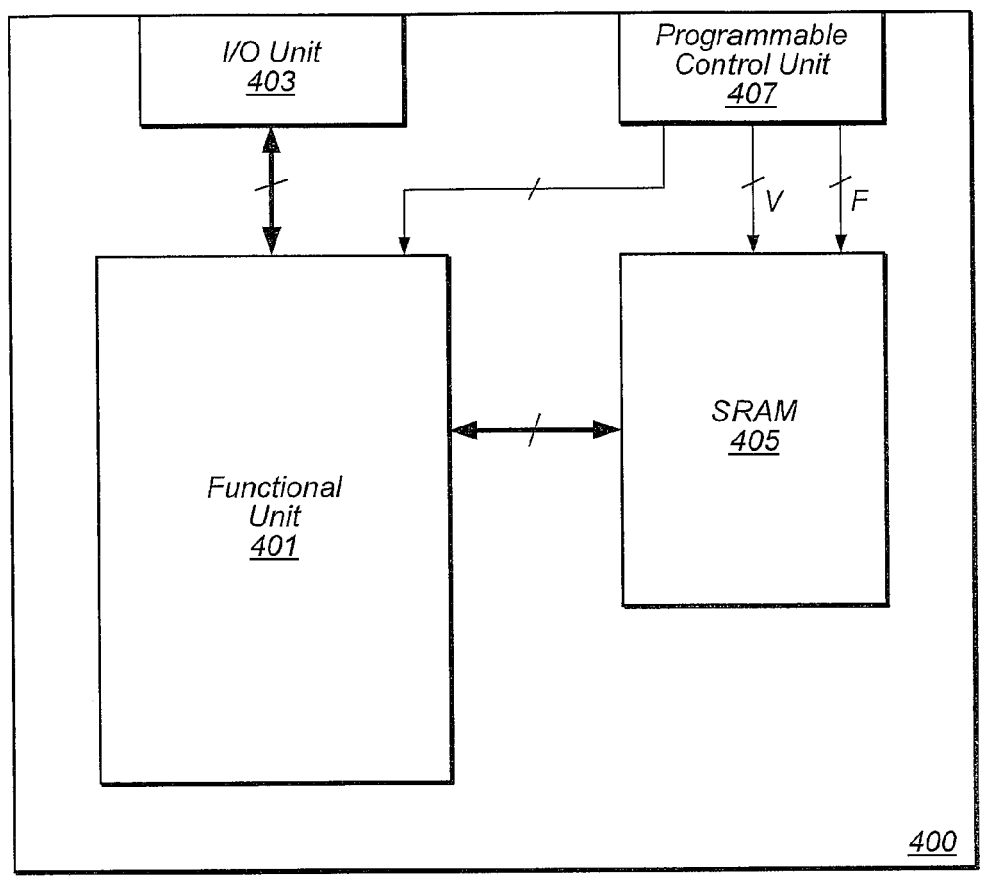
FIG. 9 is a block diagram of one embodiment of an integrated circuit.

Turning now to FIG. 9, a block diagram of one embodiment of an integrated circuit (IC) is shown. In the embodiment shown, IC 400 includes a functional unit 401, an I/O unit 403, a SRAM 405, and a programmable control unit 407. Functional unit 401 may be configured to provide any of a variety of functions, as desired, depending on the specific purpose for IC 401. For example, in some embodiments (e.g., multi-core processors), functional unit 401 may comprise a plurality of processor cores. As such, functional unit 401 may be configured to read data (or instructions) from SRAM 405 and to write data to SRAM 405. In various embodiments, SRAM 405 may form a cache memory. I/O unit 403 in the embodiment shown may be a bus interface configured to provide a path for communications between devices external to IC 400 and functional unit 401. SRAM 405 may be embodied according to the memory circuit shown in FIG. 1, and thus may include leakage control circuitry in accordance with any of the embodiments discussed above. In the depicted embodiment, IC 401 also includes a programmable control unit 407 which may be used to store control values that set the reference voltage provided from instances of the reference voltage unit 220 as described above, and may also store control values that set the frequency and/or duty cycle of the clock signal provided by instances of timer 211 as described above. In various embodiments, these control values may be detected during initialization of a system in which IC 400 is implemented, or alternatively, during any other time of operation.

In one embodiment, programmable control unit 407 is implemented using programmable fuses. However, other embodiments of IC 401 may implement programmable control unit 407 using other types of memory technology (e.g., flash memory). In some embodiments (such as embodiments utilizing programmable fuses), information may be programmed into programmable control unit 407 a single time. In other embodiments (e.g., those utilizing flash memory), the information may be reprogrammed subsequent to the initial programming, if so desired.

Figure 10:
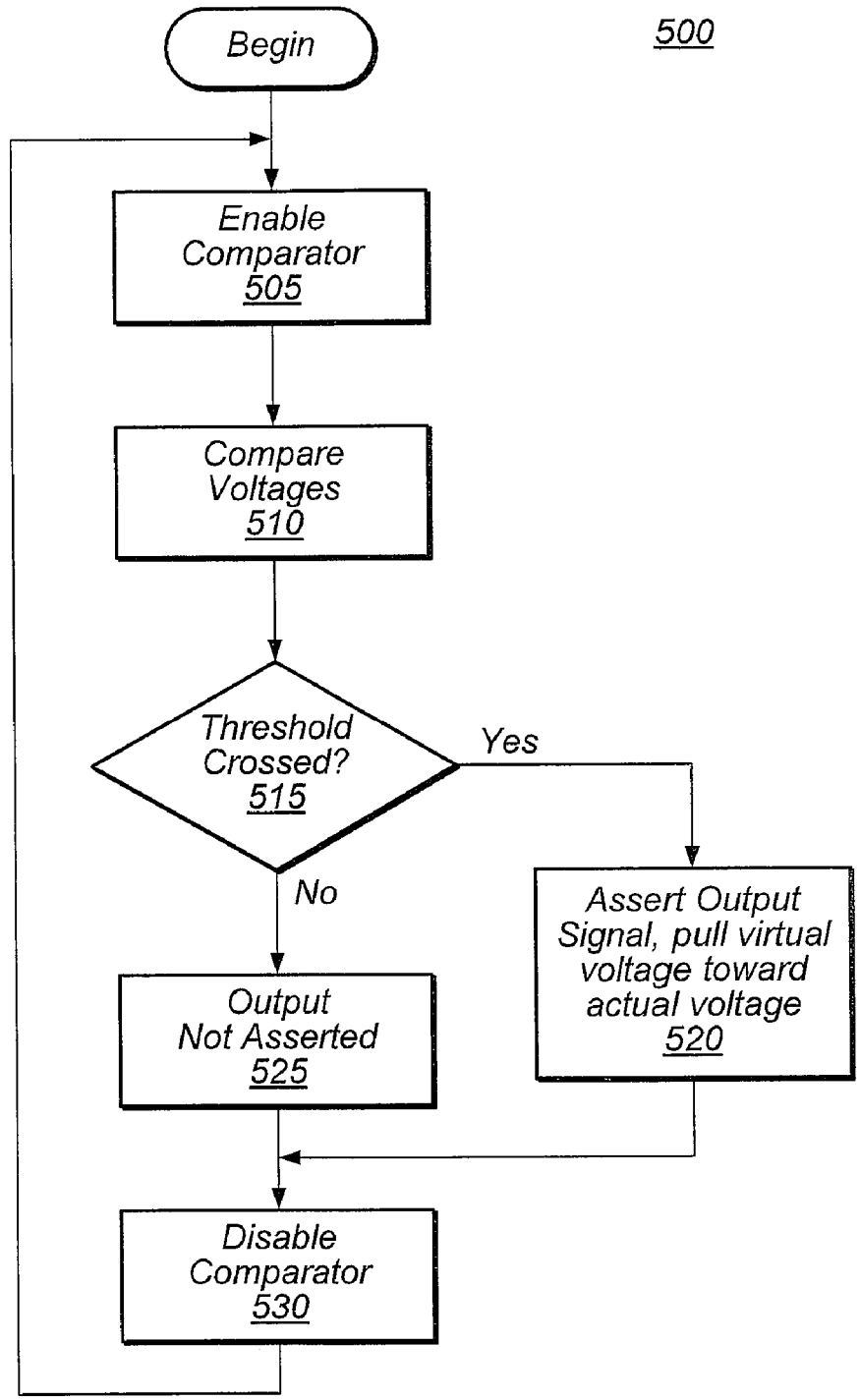
FIG. 10 is a flow diagram of one embodiment of a method for controlling leakage.

FIG. 10 is a flow diagram of one embodiment of a method for controlling leakage current in a memory circuit. Method 500 may be used in conjunction with any of the various embodiments of leakage control circuit 210 as discussed above. In the embodiment shown, method 500 begins with the enablement of a comparator 215 of leakage control circuit 210 (block 505). When enabled, comparator 215 compares the voltage on a virtual voltage rail to a reference voltage generated by a reference voltage unit 220 (block 510). If the comparator detects that the threshold has been crossed at any time while enabled (block 515, yes; e.g., virtual VSS>threshold or virtual VDD<threshold), then the comparator asserts an output signal and the voltage on the virtual voltage rail is pulled toward the voltage on the voltage rail (block 520). This may continue until either the comparator detects that the voltage on the virtual voltage rail has been pulled sufficiently toward the voltage level present on the voltage rail (thereby causing de-assertion of the comparator output signal) or until the comparator is disabled (block 530). If the comparator, while enabled, does not detect that the voltage threshold has been crossed (block 515, no), then the output signal is not asserted (block 525) and the comparator is subsequently disabled (block 530).

It is noted that in other embodiments of leakage control circuit 210 as discussed above, the bias transistors and power gater transistors may be replaced in other embodiments with alternative switching circuits implemented using additional and/or alternative components, as desired.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A memory circuit comprising:
    a plurality of memory cells coupled to a virtual voltage rail;
    a switching circuit coupled between the virtual voltage rail and a voltage supply node; and
    a comparator coupled to compare a voltage level present on the virtual voltage rail to a reference voltage and configured to provide an output signal based on the comparison;
    wherein the switching circuit is configured to electrically couple the virtual voltage rail to the voltage supply node depending upon the output signal;
    wherein the memory circuit further includes a timing unit coupled to provide a signal to selectively enable the comparator and a programmable unit configured to store one or more values to control a frequency and/or a duty cycle of the signal provided from the timing unit.

2. The memory circuit as recited in claim 1, wherein the switching circuit is a PMOS transistor, wherein source and drain terminals of the PMOS transistor are coupled to the voltage supply node and the virtual voltage rail, respectively, and wherein a gate terminal of the PMOS transistor is coupled such that the PMOS transistor is activated depending upon a state of the output signal from the comparator.

3. The memory circuit as recited in claim 1, wherein the switching circuit is an NMOS transistor, wherein drain and source terminals of the NMOS transistor are coupled to the virtual voltage rail and voltage supply node, respectively, and wherein a gate terminal of the NMOS transistor is coupled such that the NMOS transistor is activated in response to the comparator detecting that the voltage level present on the virtual voltage rail is greater than the reference voltage.

4. The memory circuit as recited in claim 1, wherein the memory circuit further includes a reference voltage unit configured to generate the reference voltage, wherein the reference voltage generated by the reference voltage unit is programmable.

5. A method comprising:
    comparing a voltage level present on a virtual voltage rail to a reference voltage, wherein the virtual voltage rail is coupled to a memory sub-array;
    providing an output signal depending on a result of said comparing; and
    activating a switching circuit depending upon the output signal, wherein the switching circuit, when activated, pulls the voltage level present on the virtual voltage rail toward a voltage level present on a corresponding voltage supply node
    comprising periodically enabling a comparator to perform said comparing; and
    controlling a frequency at which the comparator is periodically enabled to perform said comparing based on a value provided by a programmable unit configured to store one or more values to control the frequency.

6. The method as recited in claim 5 further comprising the output signal causing the switching circuit to be activated in response to detecting that the voltage level present on the virtual voltage rail is less than the reference voltage, and wherein the voltage of the virtual voltage rail is pulled up toward a voltage present on the voltage supply node when the switching circuit is activated.

7. The method as recited in claim 5 further comprising the output signal causing the switching circuit to be activated in response to detecting that the voltage level present on the virtual voltage rail is greater than the reference voltage, wherein the voltage of the virtual voltage rail is pulled down toward a voltage present on the voltage supply node when the switching circuit is activated.

8. The method as recited in claim 5 further comprising changing a pulse width of the output signal and providing a resulting enable signal to control activation of the switching circuit.

9. A memory circuit comprising:
a plurality of memory cells coupled to receive power through a first node;
a switching circuit coupled between the first node and a voltage supply node;
a comparator coupled to compare a voltage level at the first node to a reference voltage level and configured to generate an output signal depending on the comparison;
wherein the switching circuit is configured to electrically coupled the first node to the voltage supply node when in a first state and is configured to electrically isolate the first node from the voltage supply node when in a second state, wherein the first and second states of the switching circuit are dependent upon the output signal;
wherein the memory circuit further comprises a timing unit coupled to provide an enable signal to the comparator, and wherein the comparator is configured to be enabled during a first phase of the clock signal and configured to be disabled during a second phase of the clock signal.

10. The memory circuit as recited in claim 9, wherein voltage supply node is coupled to receive a voltage from a power supply unit, and wherein the comparator is configured to generate the output signal such that the switching circuit is activated in response to the voltage level at on the first node falling below the reference voltage.

11. The memory circuit as recited in claim 9, wherein the voltage supply node is a ground rail, and wherein the comparator is configured to generate the output signal such that the switching circuit is activated in response to the voltage level at on the first node rising above the reference voltage.

12. The memory circuit as recited in 9, further comprising a pulse width controller configured to reduce a pulse width of the output signal from the comparator and to provide a resulting enable signal that controls whether the switching circuit is in the first state or the second state.

13. A memory circuit comprising:
a static random access memory (SRAM) sub-array coupled to a virtual voltage rail; and
a leakage control circuit including:
a switching circuit having a first terminal coupled to the virtual voltage rail and a second terminal coupled to a corresponding voltage rail; and
a comparator having a first input terminal coupled to the virtual voltage rail and a second input terminal coupled to receive a reference voltage, wherein the comparator is configured to compare a voltage level present on the virtual voltage rail to the reference voltage and to provide an output signal based on the comparison;
wherein the switching circuit is configured to cause the voltage level present on the virtual voltage rail to be pulled toward a voltage level present on the corresponding voltage rail in response to the output signal; and wherein the leakage control circuit further includes a timer configured to generate a clock signal and coupled to provide the clock signal to an enable input of the comparator, wherein the comparator is configured to be enabled during a first phase of the clock signal and configured to be disabled during a second phase of the clock signal.

14. The memory circuit as recited in claim 13, wherein the leakage control circuit further includes a reference voltage unit configured to generate the reference voltage, wherein the reference voltage is programmable based on one or more input signals provided to the reference voltage unit.

15. The memory circuit as recited in claim 13, wherein the switching circuit is a MOS transistor.

16. An integrated circuit comprising:
a memory array including a plurality of sub-arrays, wherein each sub-array is coupled to receive power through a corresponding virtual voltage rail; and
a plurality of leakage control circuits, wherein each sub-array is associated with a respective leakage control circuit coupled to its corresponding virtual voltage rail, wherein each respective leakage control circuit includes:
a switching circuit coupled between the corresponding virtual voltage rail of the associated sub-array and a voltage supply node;
a comparator coupled to compare a voltage level present on the corresponding virtual voltage rail to a reference voltage and configured to provide an output signal based on the comparison;
a timing unit coupled to provide a signal to selectively enable the comparator; and
a programmable unit configured to store one or more values to control a frequency and/or a duty cycle of the signal provided from the timing unit;
wherein the switching circuit is configured to electrically couple the corresponding virtual voltage rail to the voltage supply node depending upon the output signal.

17. The integrated circuit as recited in claim 16, wherein the switching circuit is a PMOS transistor, wherein source and drain terminals of the PMOS transistor are coupled to the voltage supply node and the corresponding virtual voltage rail, respectively, and wherein a gate terminal of the PMOS transistor is coupled such that the PMOS transistor is activated depending upon a state of the output signal from the comparator.

18. The integrated circuit as recited in claim 16, wherein the switching circuit is an NMOS transistor, wherein drain and source terminals of the NMOS transistor are coupled to the corresponding virtual voltage rail and voltage supply node, respectively, and wherein a gate terminal of the NMOS transistor is coupled such that the NMOS transistor is activated in response to the comparator detecting that the voltage level present on the corresponding virtual voltage rail is greater than the reference voltage.

19. The integrated circuit as recited in claim 16, further comprising one or more processor cores configured to access data in the memory array.

* * * * *